United States Patent [19]

Nguyen et al.

[11] Patent Number: 5,203,360
[45] Date of Patent: Apr. 20, 1993

[54] DISC WASHING SYSTEM

[75] Inventors: Quy C. Nguyen, Milpitas; Sushil Shah, Pleasanton; William Jacobs, San Jose; Steven A. Shifman, San Ramon; William Kuhns, Pleasanton, all of Calif.

[73] Assignee: Seagate Technology, Inc., Scotts Valley, Calif.

[21] Appl. No.: 628,710

[22] Filed: Dec. 17, 1990

[51] Int. Cl.⁵ .............................. B08B 3/02
[52] U.S. Cl. .................. 134/78; 134/902; 134/153; 15/306.1; 414/226
[58] Field of Search .............. 134/61, 76, 153, 902, 134/198, 142, 66, 78; 15/308, 306 R; 414/222, 225, 226

[56] References Cited

U.S. PATENT DOCUMENTS

| | | | |
|---|---|---|---|
| 4,064,885 | 12/1977 | Dussault et al. | 134/902 X |
| 4,694,527 | 9/1987 | Yoshizawa | 134/61 X |
| 4,739,780 | 4/1988 | Czaja et al. | 134/61 |
| 4,788,994 | 12/1988 | Shinbara | 134/902 X |
| 4,850,381 | 7/1989 | Moe et al. | 134/902 X |
| 4,924,890 | 5/1990 | Giles et al. | 134/76 X |
| 4,936,329 | 6/1990 | Michael et al. | 134/902 X |
| 4,985,722 | 1/1991 | Ushijima et al. | 134/902 X |

FOREIGN PATENT DOCUMENTS

304732 12/1989 Japan .................. 134/902

Primary Examiner—Frankie L. Stinson
Attorney, Agent, or Firm—Flehr, Hohbach, Test, Albritton & Herbert

[57] ABSTRACT

An automated disc washing machine having, in sequence, a loading station for loading a disc into the disc washing machine, at least one cleaning station for cleaning a disc, and an unloading station for unloading a cleaned disc from the disc washing machine. The disc washing machine also has a pivoted transfer arm connected adjacent the sequence of loading, cleaning and unloading stations for sequentially transferring a disc from the loading station to the cleaning station in one complete transfer cycle of the arm and from the cleaning station to the unloading station in another complete transfer cycle of the arm.

43 Claims, 6 Drawing Sheets

DISC WASHING SYSTEM

BACKGROUND OF THE INVENTION

1. Field of the Invention

The present invention relates to a disc washing machine for washing computer "hard discs" during the processing sequence. More specifically, the present invention relates to an automated cassette-to-cassette disc washing machine having disc transfer means including a pivoted transfer arm for sequentially and simultaneously transferring discs from one station in the disc washing machine to a subsequent station.

2. Prior Art

Hard disc drives for computer memory are mass produced through automated manufacturing techniques. An aspect of this automated manufacturing technique is washing a disc one or more times during the process. The automated disc washing machines of the prior art and that of the present invention are configured for this purpose, yet function in a significantly different manner.

There are several processing steps that many automated disc washing machines have in common. The first is a loading station where unwashed discs may be readily loaded from a cassette into the disc washing machine. The second is a washing station where the discs are washed with a cleaning solution. The third is a rinsing area where the discs are rinsed. The fourth is a drying station where the discs are spun dry and the fifth is an unloading station where washed discs may be easily unloaded into a cassette. The cassette can then be unloaded by an attendant.

The most advanced prior art automated disc washing machine is manufactured by Hitachi. In this apparatus, discs enter at a loading station and drop to a washing station. The discs move generally clockwise from station to station, in a vertical carousel arrangement. This carousel configuration of the Hitachi disc washing machine loads and unloads discs from the same side of the disc washing machine.

SUMMARY OF THE INVENTION

It is an object of the present invention to provide a disc washing machine having disc transfer means including an arm mechanism which transfers discs simultaneously from one station in the disc washing machine to an adjacent station.

It is another object of the present invention to provide a disc washing machine in which discs are not received and discharged on the same side of disc washing machine, thereby permitting easier integration into an automated system.

The attainment of these and related objects may be achieved through use of the novel automated disc washing machine herein disclosed. An automated disc washing machine in accordance with this invention has, in sequence, a loading station for loading a disc into the disc washing machine, at least one cleaning station for cleaning a disc, and an unloading station for unloading a cleaned disc from the disc washing machine. The machine also has disc transfer means including a pivoted transfer arm connected adjacent the sequence of loading, cleaning and unloading stations for sequentially transferring a disc from the loading station to the cleaning station in one complete transfer cycle of the arm and from the cleaning station to the unloading station in another complete transfer cycle of the arm.

The attainment of the foregoing and related objects, advantages and features of the invention should be more readily apparent to those skilled in the art, after review of the following more detailed description of the invention, taken together with the drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1:
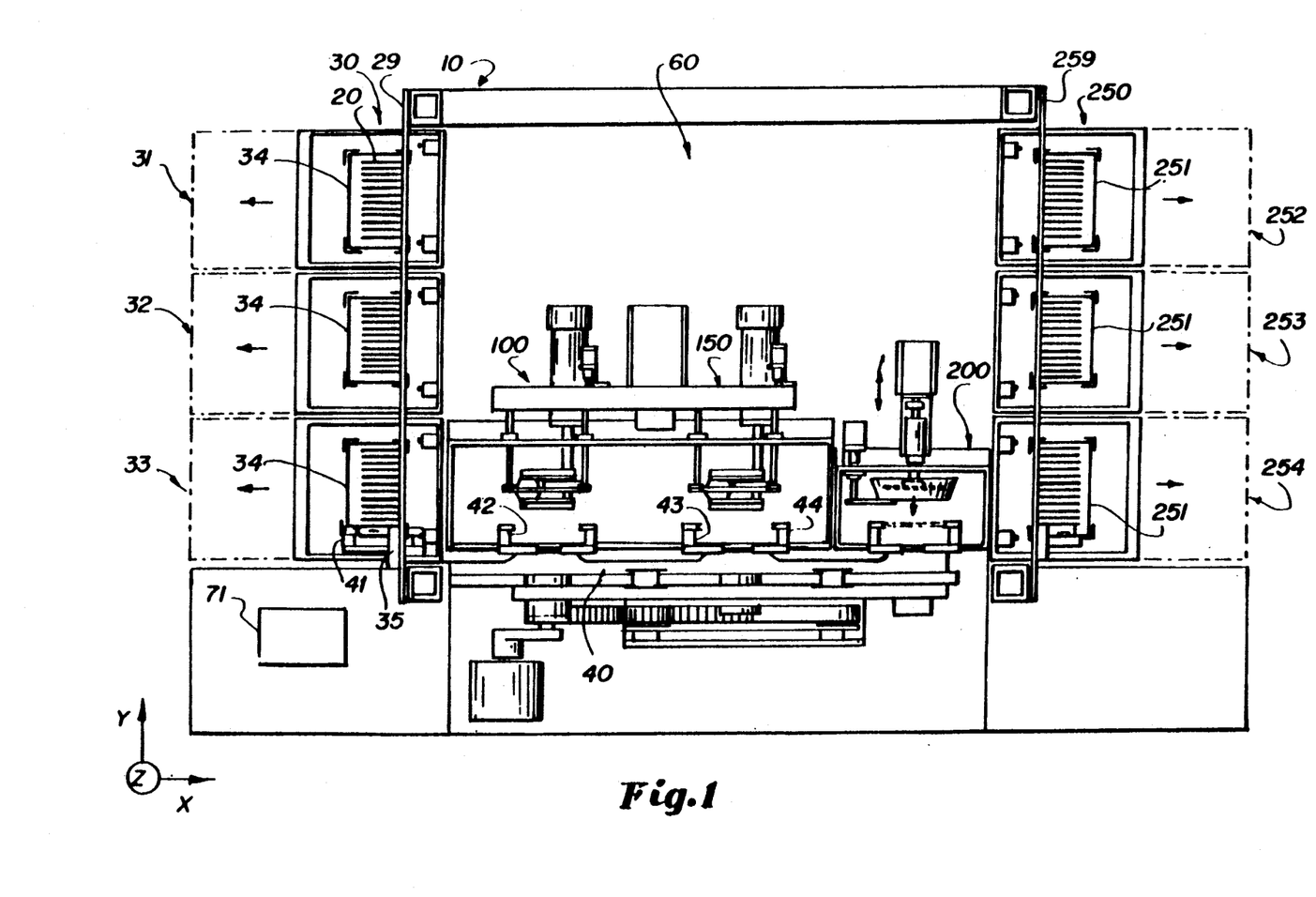
FIG. 1 is a plan view of the disc washing machine of the preferred embodiment.

Referring to FIG. 1, a top view of the preferred embodiment is shown. With respect to the location of discs in the disc washing machine 10, there are five primary stations. The first is the loading station 30. As the name implies, discs 20 are loaded at the loading station into the disc washing machine 10. The disc loading station 30 is comprised of three sections 31-33 in which cassettes 34 containing discs 20 may be placed. A vertical gripper apparatus 35 (see also FIG. 2) mounted to a linear slide 29 is placed above the sections 31-33 in such a manner that the vertical gripper 35 may extend into cassettes 34 and remove a disc 20. Note that although the vertical gripper of the present invention is unique, suitable gripper mechanisms are generally known in the art. The vertical gripper 35 transports the disc 20 along linear slide 29 into a position to be accepted by a horizontal gripper 41 (only a portion of this device is visible in FIG. 1). The horizontal gripper 41 is one of four horizontal grippers 41-44 which are positioned on the transfer arm 40. The transfer arm 40 and related componentry are discussed in more detail with reference to FIG. 2.

Once a disc 20 has been picked up by vertical gripper 35 and linear slide 29, and moved into position to be gripped by horizontal gripper 41, the horizontal gripper 41 is activated to grip the disc 20. During the same time period, discs are moved from the disc washing station 100, the disc rinsing station 150, and the disc drying station 200 into position to be gripped by horizontal grippers 42, 43, and 44, respectively. The horizontal grippers 41-44 are then actuated to close about their respective discs, thereby securing those discs. Once secured, the transfer arm 40 is activated, simultaneously transferring the discs to the right (from the perspective of FIG. 1) to a subsequent station. The horizontal gripper 41 is then positioned at washing station 100, horizontal gripper 42 at rinsing station 150, horizontal gripper 43 at drying station 200 and horizontal gripper 44 at output station 250. The discs are released at these stations 100, 150, 200 and 250, and the transfer arm 40 is returned to its previous position.

A vertical gripper 255 and linear slide 259, similar to those present at the input station 30, are provided at output station 250. The vertical gripper is moved into position to receive the disc at horizontal gripper 44. During the same time period, securing componentry (to be discussed with reference to FIGS. 5 and 7) in the washing station 100, the rinsing station 150 and the drying station are positioned to receive discs held by horizontal grippers 41, 42 and 43, respectively. The horizontal grippers 41-44 release their respective discs which are secured by the above mentioned securing componentry (described in more detail below). Once the discs have been released and retracted by the securing componentry, the transfer arm 40 is moved backwards toward the left so that a new disc may be received at the loading station 30 and also so that discs at the washing station 100, rinsing station 150, and drying station 200 can be advanced to their subsequent stations.

At the unloading station 250, the disc released by horizontal gripper 44 is moved into an unloading cassette 251 in one of the unloading stations 252-254. The vertical gripper 255 and linear slide 259 are identical to those used at the loading station 30, and illustrated in FIG. 4, but operated in a generally reverse manner.

Figure 2:
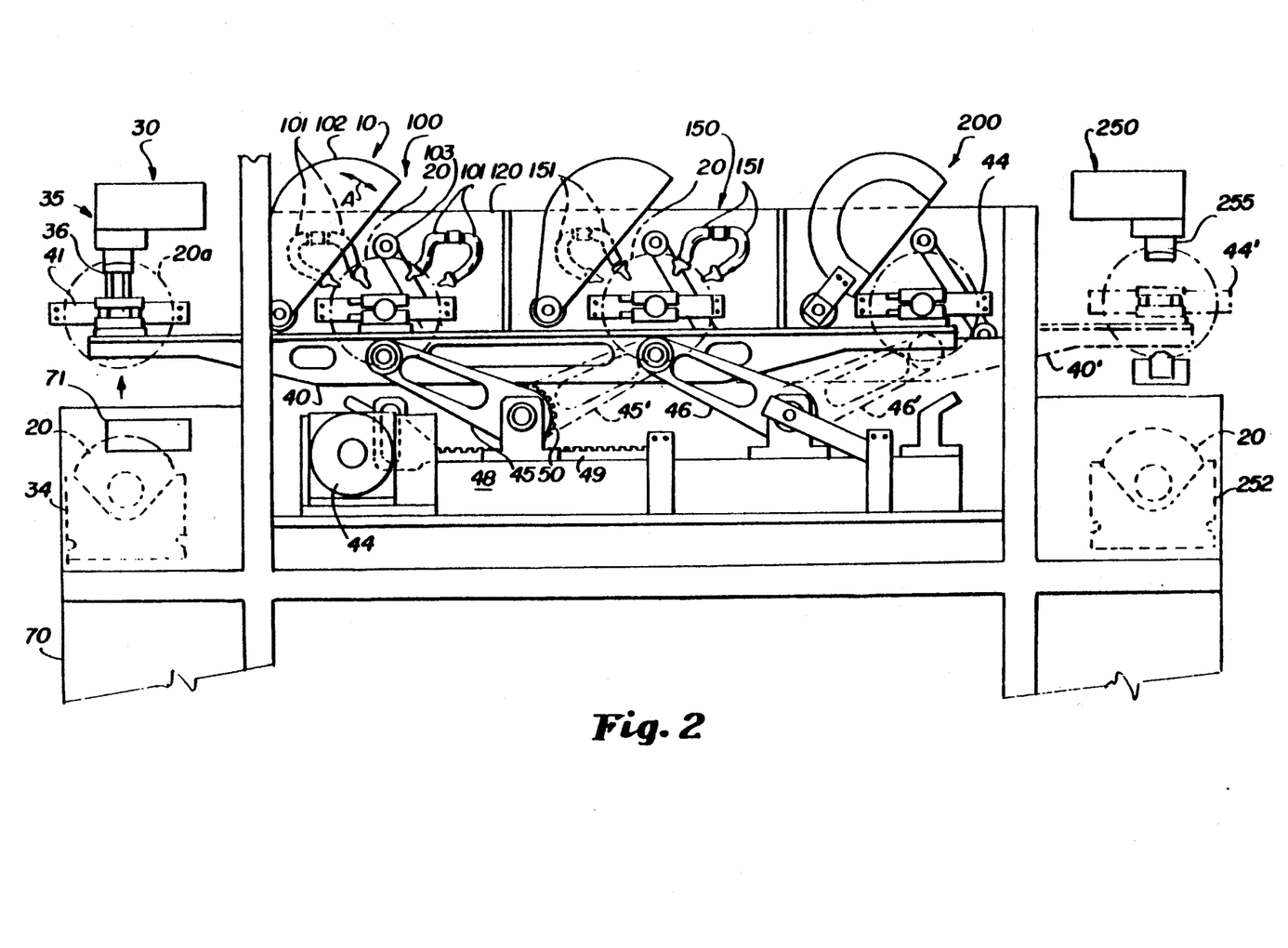
FIG. 2 is a front elevation view of the disc washing machine of the preferred embodiment.

Referring to FIG. 2, a front view of the disc washing machine 10 of the preferred embodiment is shown. Beginning at loading station 30, the vertical gripper 35 is extended into cassette 34 to extract a disc 20. The disc 20 is raised vertically by the gripper 35 and moved horizontally by linear slide 29 into a position where it can be received by horizontal gripper 41. Once the horizontal gripper 41 has securely retained the disc 20a the vertical gripper 35 releases the disc 20a and is moved out of the vertical plane of the disc by linear slide 29. Once the disc 20a is secured by gripper 41 (and discs from the other stations are secured by horizontal grippers 42-44) the transfer arm 40 is moved into position 40'. When the transfer arm is in position 40', horizontal gripper 41 is located at station 100, gripper 42 at station 150, gripper 43 at station 200 and gripper 44 (indicated as 44') at station 250. At position 40' the discs are released to new station and the transfer arm 40' is then returned to the position indicated by reference numeral 40. The arm 40 is moved by an air motor 47. The air motor 47 moves a slidable platform 48 on which is mounted a teethed track 49. A gear 50 having the same teeth structure as the track 49 is engaged therein. The gear 50 is mounted securely to a pivot arm 45 supporting the transfer arm 40. A free pivot arm 46 is also provided. The free pivot arm 46 also supports transfer arm 40, but is not connected to the arrangement of gear 50 and track 49. Activation of air motor 47 moves slidable platform 48 and the track thereon, thereby turning gear 50, pivot arm 45 and the transfer arm 40. When the transfer arm 40 is activated and moved to position 40' the free pivot arm 46 moves to position 46'.

The air motor 47 utilized to move the transfer arm 40 is powered by air (from an external source) and controlled by a computer 70 which is located approximately under the loading station sections 31-33. A suitable computer for this purpose is the PLC by Allen Bradley. The generation of suitable algorithms to control timing and movement of the various mechanical components of the disc washing machine 10 is well known in the art. A control panel 71 is located on the upper right hand portion of the disc washing machine 10 (from the perspective of FIG. 2). The control panel 71 permits operator input to the computer 70. The control panel 71 also permits readout of disc washing machine 10 status. The suitable control panel is provided with the PLC computer, although an equivalent panel may be provided from other sources.

Referring to washing station 100, the washing station 100 is comprised of a plurality of components which function to wash the entire surface of disc 20. From the perspective of FIG. 2, a plurality of nozzled hoses 101 protrude from back wall 120. These nozzled hoses 101 are used to spray a cleaning solution onto each disc in the washing station 100. A suitable cleaning solution is Alprep 230 by Witco Chemical Corporation. A shield 102 is provided which moves as indicated by arrow A from an up position illustrated in FIG. 2 to a down position (shown cut-away in FIG. 5). In the down position, the shield 102 protects the operator from expelled washing fluid or other projectiles which may be thrown from the washing station 100.

As will be discussed in more detail below, a disc 20 at the washing station 100 is rotatably secured on three freely rotating wheels 103. These wheels 103 are mounted on retracting shafts (not visible from the perspective of FIG. 2). A plurality of rotating cleaning brushes are brought into contact with the disc, the rotation of the cleaning brushes (180 of FIGS. 5-7) causing the disc to rotate such that in each wash cycle the entire flat surface of each disc rotates past the cleaning brushes 180. (The cleaning brushes are discussed more thoroughly with reference to FIGS. 5 and 6). The brushes 180 are then disengaged from the disc 20 and the disc is extended from the back wall 120 so that it may be received by horizontal gripper 42 which has been moved back to the washing station 100 as transfer arm 40 moves from position 40' to position 40.

The horizontal gripper 42 and transfer arm 40 are then activated to transfer the disc 20 to the rinsing station 150. A procedure similar to that discussed with reference to the washing station 100 is carried out at the rinsing station 150, except rinsing fluids, not cleaning fluids, are delivered by hoses 151.

After rinsing, the disc 20 is transferred via transfer arm 40 to drying station 200. At the drying station 200 a device is inserted into the center hole of the disc 20. The device expands to contact and securely hold the center hole of the disc 20. The washed and rinsed disc 20 is then rotated at high speed expelling all residual moisture by centrifugal force. Lastly, the transfer arm 40 is again utilized to deliver disc 20 from the drying station 200 to unloading station 250 where the disc is placed into a waiting cassette 252.

Figure 3:
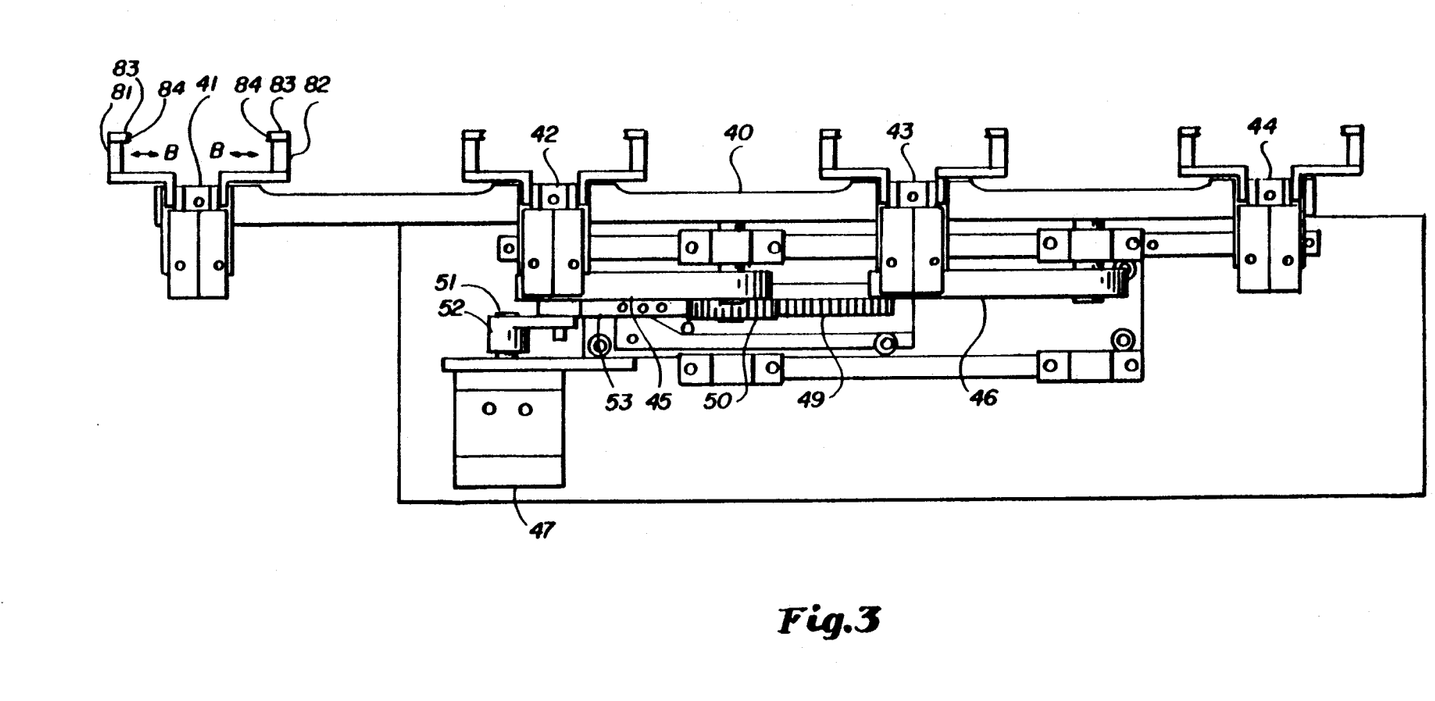
FIG. 3 is a top view of the transfer arm mechanism of the preferred embodiment.

Referring to FIG. 3, the top view of the transfer arm mechanism will now be described, primarily indicating the relation of the horizontal grippers 41-44 and illustrating the drive components of the transfer arm 40. The physical structure and movement of the horizontal grippers 41-44 will be discussed first, followed by transfer componentry which includes a drive track 49, two pivot arms 45-46 and an air motor 47.

Each of the horizontal grippers 41-44 are identical. They are driven by air pressure from a external air supply which causes the gripping members 81-82 to move inward and outward as indicated by arrows B. At the end of members 81 and 82 there are disc receptacles 83. The disc receptacles 83 are made of a soft rubber having a slit 84 therein. The slit 84 is configured to receive the edge of a disc 20. Calibration techniques for assuring that the members 81 and 82 move a sufficient distance to securely maintain and release a disc are well known in the art. Each of the horizontal grippers 41-44 are mounted to the transfer arm 40 where they may readily receive and deposit discs.

The transfer arm 40 to which the horizontal grippers 41-44 are attached in connected to the remainder of the disc washing machine 10 by pivot arms 45 and 46. The complete physical connection between transfer arm 40 and pivot arms 45 and 46 is obscured by horizontal grippers 42 and 43.

The componentry which results in movement of the transfer arm will now be discussed. An air motor 47 is provided with a shaft 51 protruding therefrom. A connector 52 is mounted between the shaft 51 and also to a horizontally slidable member 53 (the slidable member 53 moves from left to right and vice versa, in the perspective of FIG. 3). The slidable member 53 has a drive track 49 mounted thereon. When air motor 47 turns shaft 51, connector 52 moves member 53 and the affixed track 49. Movement of the track 49 results in movement of a corresponding gear 50 which has a teeth pattern consistent with that of the drive track 49. Movement of the gear 50 which is connected to pivot arm 45 produces a resultant movement in pivot arm 45 which moves the transfer arm 40. Note that other motors could be used instead of the air motor 47. These motors are well known in the art. A primary reason for using an air motor in the preferred embodiment is because there are other components, such as the horizontal grippers 41-44 which are driven off an external air pressure supply. The air motor 47 may simple be driven off of that supply.

Thus, in this manner the transfer arm 40 is capable of moving four discs sequentially and simultaneously. The exposed configuration of the disc washing machine 10 permits a disc to be easily intercepted as it transfers from one station to another for inspection or extraneous processing. The action of the horizontal grippers 41-44 and the movement of the transfer arm 40 combine to produce a uniform, secure and accountable transfer of discs through the disc washing machine.

Figure 4:
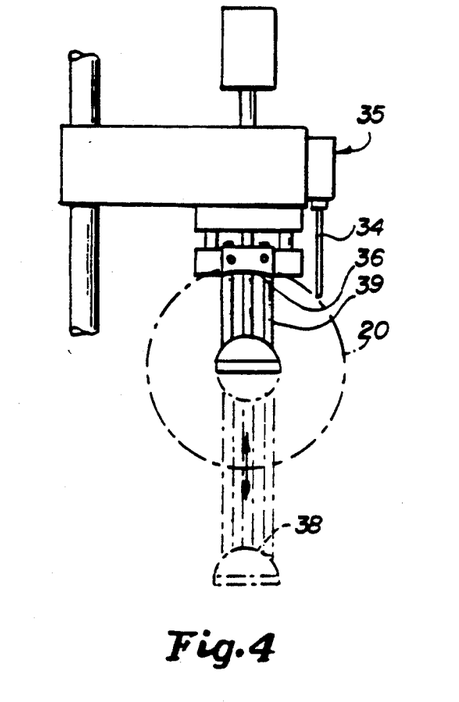
FIG. 4 illustrates a disc loading and unloading device of the preferred embodiment.

Having described the movement of the transfer arm, attention is now draw to FIG. 4 where the gripper assemblies which move a disc out of an input cassette to the first horizontal gripper 41 and from the last horizontal gripper 44 to an output cassette are disclosed. Referring to FIG. 4, the vertical gripper assembly of the loading and unloading stations is illustrated. The vertical gripper description which immediately follows will reference the loading station 30, but is equally applicable to the unloading station 250.

The vertical gripper 35, which is also driven by air, is basically comprised of three components which enable the gripper to reach into a cassette, securely retain the cassette and release the cassette at the first horizontal gripper 41. These three components are the outer receiving member 37, the inner receiving member 38 and shaft 39 connected therebetween. To lift a disc 20 out of a cassette 34 the linear slide 29 moves the vertical gripper 35 into a vertical plane parallel to and adjacent the vertical plane of the disc 20 desired to be picked up. The shaft 39 is then extended downward until the inner receiving member 38 is positioned at the same height as the center hole of a disc 20. The cooperating linear slide 29 then moves the inner receiving member 38 into the center hole of the disc such that the inner receiving member 38 is in the same vertical plane as the disc 20. The shaft 39 is then retracted causing the inner receiving member 38 to receive an inside edge of the center hole of the disc 20 and lift the disc 20 vertically upward. The shaft 39 is further retracted until the outer edge of disc 20 contacts the outer receiving member 36. A sensor 37 is provided to confirm the position of the disc 20 in the vertical gripper 35. The sensor 37 is a simple light sensor of the type well known in the art and basically indicates whether a disc is contained within the inner and outer receiving members 36 and 38. Once the presence of a disc is confirmed, the disc is moved by the inner slide into position to be gripped by horizontal gripper 41. Note that this procedure operates in reverse at the disc unloading station 250.

Another important aspect of the present invention is the movement of cleaning brushes into contact with a disc in a manner which does not interfere with the movement of the transfer arm 40 and the general transfer of discs through the machine. Movement of the brushes into contact with a disc is accomplished by use of a unique rotary actuator and brush housing mechanism situated at a lower portion of the rinsing station 150 beneath were the transfer arm 40 receives and dispenses a disc. The movement of the cleaning brushes into contact with a disc is now illustrated.

Figure 5:
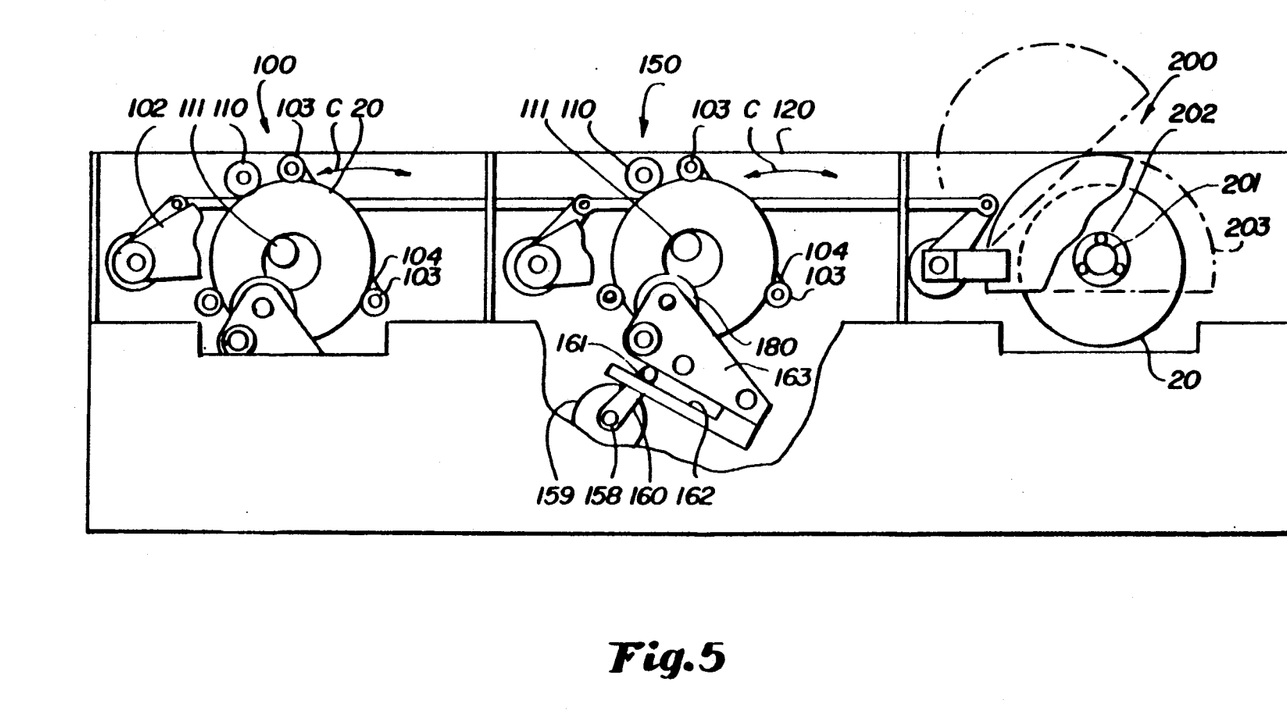
FIG. 5 illustrates a front partially cut-away view of the disc washing, rinsing and drying stations of the disc washing machine of the preferred embodiment.

Referring to FIG. 5, a cutaway front view of the disc washing, disc rinsing and disc drying stations 100, 150 and 200, respectively, of the preferred embodiment is shown. The emphasis in FIG. 5 is to further illustrate how the cleaning stations of the present invention operate, specifically focusing on how the brush mechanisms are pushed in place to contact the disc 20 (note the cut-away drawing of the rinsing station 150 illustrating this feature).

Referring to the rinsing station 150 which will be used for purposes of illustration (note that the mechanism of the washing station 100 is identical), a shaft 158 extends from the back wall 120 into the rinsing station 150. The shaft 158 is connected to a rotary actuator on the other side of the back wall 120. Attached to the shaft 158 is a drive wheel 159 and a radially rotating shaft 160. The radially rotating shaft 160 has a connecting member 161 which is slidably engaged in slot 162 in brush housing 163. Radial movement of the shaft 160 causes the brush housing 163 to move between a position in which the brushes (180 of FIG. 6A) fully engage the disc 20 to a position in which the brushes are totally disengaged from the disc 20.

Also illustrated in FIG. 5 are exterior and interior cleaning members 110 and 111. The members 110, 111 are made out of a foam or other suitable cleaning material. The exterior cleaning member 110 cleans the outer edge of a disc 20, the interior cleaning member 111 cleans the inner edge of a disc 20. Also present in FIG. 5 are the rotating securing wheels 103, discussed briefly above. The wheels 103 securely yet rotatably hold the disc 20 in the disc washing station 100 and disc rinsing station 150. A shaft 104 connects first and second freely rotating wheels 103. The shaft 104 rotates as indicated by arrow C between a position in which a disc is securely held to a position in which a disc is unsecured.

Also illustrated in FIG. 5 is a front view of the drying station 200. Although operation of the drying station 200 is discussed in more detail with reference to FIG. 7, those features of the drying station 200 visible from the perspective of FIG. 5 are now discussed. Referring to the drying station 200, a central shaft 201 is provided from which diverge three disc securing members 202. These three members 202 project radially outward from the end of shaft 201 to secure the inner edge of the center hole of a disc 20. The shaft 201 is retracted carrying the disc 20 therewith and dome 203 is then lowered over the retracted disc. Once the dome 203 covers the disc, the shaft 201 rotates, rotating the disc 20 secured thereon. The disc 20 is then spun at high speed for a short duration to expel all residual moisture.

Figure 6A:
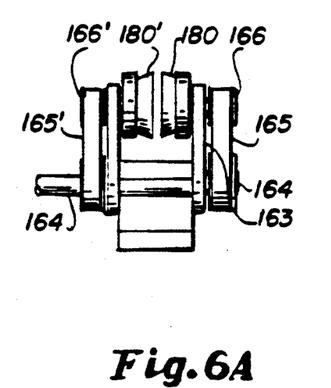
FIGS. 6A and 6B illustrate the disc washing mechanisms of the washing station of the preferred embodiment.
Figure 6B:
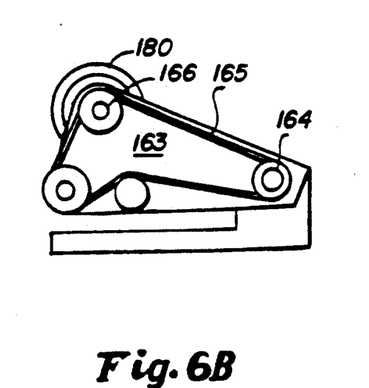

Referring to FIGS. 6A and 6B, the washing and rinsing brush mechanisms of the preferred embodiment are shown and will now be described. The function of the brush mechanisms is two fold: (1) to non-abrasively scrub the flat portion of each disc 20 and (2) to rotate each 20 within the washing and rinsing stations 100 and 150 so that the entire flat surface of each disc passed between the brush mechanisms.

More specifically, the brush housing 163 receives a drive shaft 164. The drive shaft 164 (see FIG. 7 for a plan view) extends from back wall 120 where it is powered by a motor 64 and drives pulley 165 which rotates brush shaft 166. The brush shaft 166 is connected to one of a pair of brushes 180, thereby turning the brushes 180. A similar arrangement is provided on the opposite side of the brush mechanism 163. A pulley 165' rotates brush shaft 166' which turns the other of the pair of brushes 180'. This brush mechanism is moved to engage a disc as discussed above with reference to FIG. 5.

Figure 7:
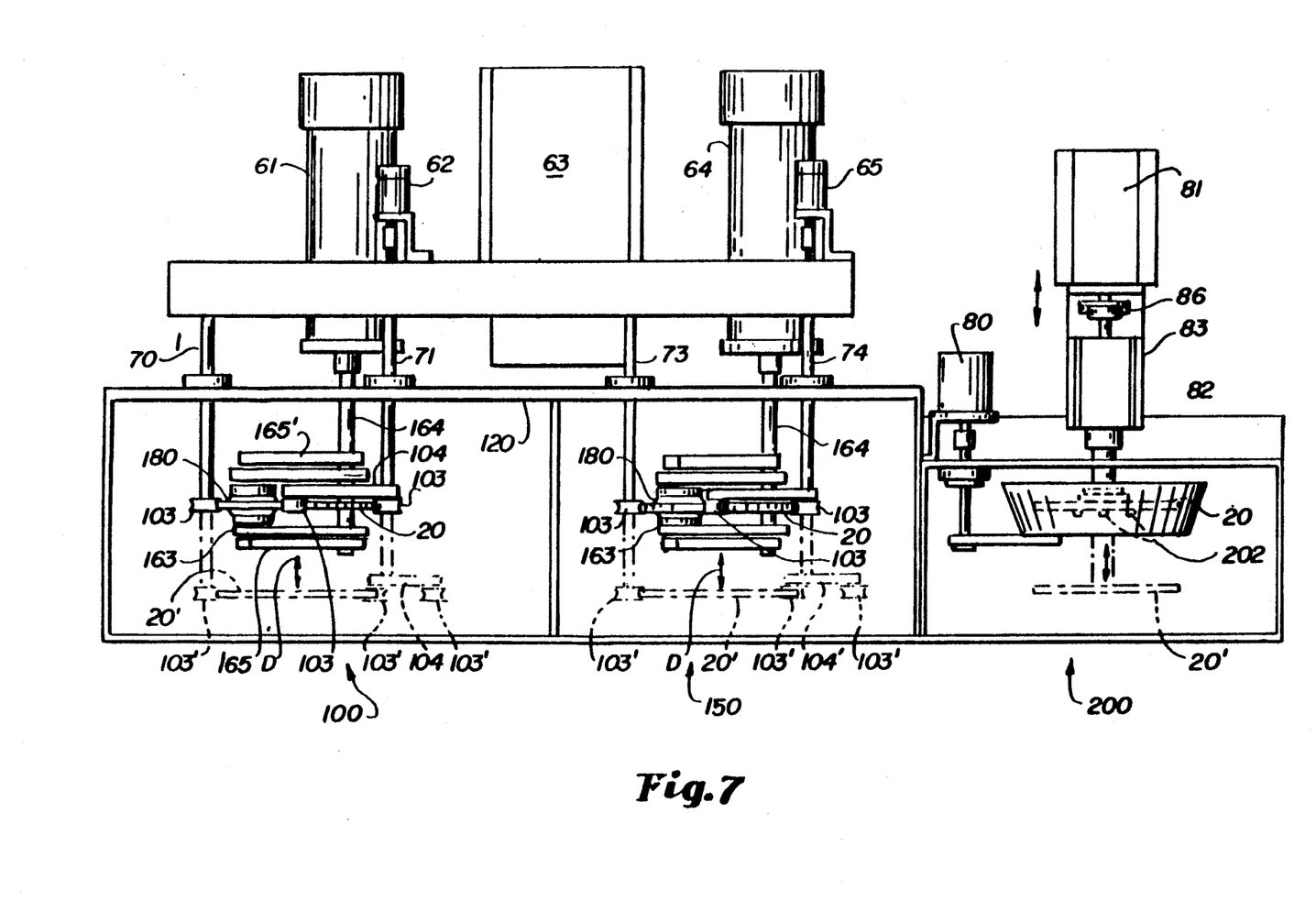
FIG. 7 illustrates a top view of the disc washing, rinsing and drying stations of the disc washing machine of the preferred embodiment.

Referring to FIG. 7, a top plan view of the washing, rinsing and drying stations, 100, 150 and 200, respectively, of the preferred embodiment is shown. The primary purpose for the perspective of FIG. 7 is to illustrate the motor and shaft arrangements which drive the various components of the washing, rinsing and drying stations 100, 150 and 200 The componentry of FIG. 7 is the same as that illustrated in FIG. 5, with the exception that FIG. 5 is a front view.

When the transfer arm 40 is activated, transferring discs one station to the right, the transferred discs are moved into vertical alignment (at the washing and rinsing stations 100 and 150) with the bottom two rotating securing wheels 103. The wheels 103 are extended from the back wall 120 (on shafts 70–71 and 73–74, see FIG. 7) to receive the discs. As will be discussed in more detail below, once the disc are transferred to the washing and rinsing stations 100 and 150, a third wheel is rotated into contact with the disc in such a manner as to form an equilateral triangle with the other two wheels 103, thereby securing the disc at three equally spaced points. Once this third wheel has been moved into position, the disc receptors 83 (see FIG. 3) release each disc. The disc is then retracted into the respective cleaning stations and the transfer arm 40 pivots back to its previous position.

The components responsible for retracting a disc from and extending a disc to the transfer arm 40, and the components which drive the cleaning stations will now be discussed. Referring to the washing station 100, the mechanism for retracting a disc 20 into the washing station 100 is shown. There are two extension shafts 70 and 71 which extend and retract from back wall 120 to transport a disc 20. When a disc is transferred by transfer arm 40, it is placed in position 20' so that it rests on rotating wheels 103'. A rotary actuator 62 is utilized to rotate shaft 104' towards the disc 20' as indicated by arrow C in FIG. 5. The shaft 104' moves the topmost rotating wheel 103' into position to rotatably secure the disc 20'. Once the top wheel 103' has been moved into position to secure the disc 20', the horizontal gripper (41, in this instance) releases the disc 20'. A linear actuator 63 connected to extension shafts 70–71 and 73–74 is utilized to move the disc 20' into the washing station 100 to a position indicated by disc 20. The brush mechanism 163 (illustrated in FIGS. 5 and 6) is then actuated to engage the disc 20. The features of the disc mechanism 163 which include the pulleys 165 and 165', the brushes 180 and drive shaft 164 as described with reference to FIG. 6 are visible from the perspective of FIG. 7. A DC brush motor 61 is provided to power drive shaft 164 and thereby turn the brushes 180 which clean the disc (note that an AC motor could alternatively be used).

Once a disc has been cleaned, the brush mechanism 163 is disengaged from the disc 20 as described with reference to FIG. 5. The linear actuator 63 then extends extension shafts 70–71 and 73–74 to place the disc 20 back in position 20' so that a vertical gripper (42, in this instance) may be activated to secure the disc 20'. Once this occurs, rotary actuator 62 is activated to rotate extension shaft 71 such that shaft 104 is placed in position 104' and the top securing wheel 103 is moved to position 103'. The transfer arm 40 is then actuated to move to position 40' (moving horizontal gripper 42 from the washing station 100 to the rinsing station 150) and transferring the disc at the washing station 100 to the rinsing station 150 where it is received by the bottom two rotating wheels 103'.

The process which occurred at the washing station 100 is repeated at the rinsing station 150. A rotary actuator 65 is actuated to rotate extension arm 74 such that shaft 104' is rotated towards the disc 20', thereby moving the top securing wheel 103' into position to secure the disc 20'. The linear actuator 63 is then actuated to retract extension shafts 73 and 74, thereby moving disc 20' into position 20. A brush mechanism 163 is moved to engage the disc 20 as at the washing station 100. An DC brush motor 64 is utilized to turn drive shaft 164, thereby rotating the brushes 180 to clean the disc 20. Note that the extension shafts 73 and 74, the brush mechanism 163, the rotary actuator 65 and DC brush motor 64 operate substantially simultaneously with their counterparts in the washing station 100.

At the drying station 200 a spindle shaft 82 (201 of FIG. 5) is provided that extends from a spindle housing 83. When the transfer arm 40 is activated, a disc is moved into position 20'. The spindle shaft 82 is extended into the plane of the disc 20' and three securing members 202 diverged to contact the central opening of the disc 20'. The spindle shaft 20 is then retracted and protective shield 203 is lowered over the disc 20. The protective shield 203 is actuated by a rotary actuator 80. The disc 20 is spun by an DC brush motor 81. This DC brush motor is capable of operating up to 1,750 RPMs, as are DC brush motor 61 and 64. A 3:1 pulley arrangement 86 is provided between motor 81 and spindle shaft 82. The spindle shaft 82 with disc secured thereon is spun at approximately 5,000 RPMs for a period of approximately 12 seconds. Upon completion of the spin cycle, the protective shield 203 is raised and the disc 20 is extended by the extension of spindle shaft 82 to place the disc back in position 20'. The disc 20' is received by horizontal gripper 44 of transfer arm 40 and then moved to the unloading station 250 upon activation of the transfer arm 40 during a "transfer cycle."

At the unloading station 250, the disc 20 is by a vertical gripper 255 which operates the same as vertical gripper 35 at the loading station. A linear slide 259 moves the vertical gripper 255 into position to lower a cleaned disc into a waiting cassette 252-254 which may then be unloaded by an operator.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An automated disc washing apparatus, comprising:
    in sequence, loading means including a loading station for loading a disc into said disc washing machine;
    at least one cleaning station for cleaning a disc; and
    unloading means including an unloading station for unloading said cleaned from said disc washing machine;
    said disc washing apparatus further comprising:
    disc transfer means, including transfer arm means capable of pivoting between a first position for receiving said disc and a second position for unloading said disc, and being located adjacent said sequence of said loading station, said cleaning station and unloading station, for sequentially transferring a first disc from said loading station to said cleaning station and simultaneously transferring a second disc from said cleaning station to said unloading station in a first transfer cycle and for transferring said first disc from said cleaning station to said unloading station and simultaneously transferring a third disc from said loading station to said cleaning station in a second transfer cycle, each full cycle of said disc transfer means accomplishing one of each of said station to station transfer cycles, for sequentially and linearly transferring said discs from said loading means through said cleaning station and to said unloading means.

2. The apparatus of claim 1 wherein said disc transfer means further comprises:
    first and second pivot arm means for supporting said transfer arm means as said transfer arm means pivots between a first position adjacent line of said stations and a second position also adjacent line of said stations but advanced along the direction of the line of said stations by a distance equal; to the distance between each station; and
    arm motor means for moving said first pivot arm means and said transfer arm means between said first and second position.

3. The apparatus of claim 2 wherein disk transfer means further comprises:
    engaging means connected between said first pivot arm means and said arm motor means for engaging said arm motor means and said first pivot arm means so that excitation of said motor means results in excitation of said first pivot arm means and said transfer arm means supported thereon.

4. The apparatus of claim 2 wherein said disk transfer means further comprises a plurality of horizontal disc gripping means mounted to said transfer arm, each of which said horizontal disc gripping means is capable of holding and conveying a disc between a pair of adjacent stations, each of said pair of stations comprising either said loading station and one of said cleaning stations, or two of said cleaning stations, or one of said cleaning stations and said unloading station, and
    wherein said disk transfer means includes means connecting said arm motor means and said first pivot arm means in such a manner that actuation of said motor coordinates movement of said horizontal disc gripping means to simultaneously transfer discs from said loading station to said cleaning station and from said cleaning station to said unloading station.

5. The apparatus of claim 4 wherein said horizontal disc gripping means comprise first and second gripping arm members having disc receptacles on ends thereof for gripping said disc during operation of said disc transfer means.

6. The apparatus of claim 5 wherein said first and second gripping arm members are coupled to a source of air pressure and driven by said air pressure source into and out of engagement with said disc to securely grasp said disc for transfer without damage to said disc.

7. The apparatus of claim 2 wherein said arm motor means comprise a toothed track movable essentially parallel to the configuration of said stations and gear means integral with said first pivot arm means supporting transfer arm means and meshing therewith movement of said toothed track causing coordinated movement of said pivot arm means and transfer arm means to transfer said discs from station to station.

8. The apparatus of claim 7 wherein said loading means includes means for withdrawing said discs one at a time from a cassette and presenting them to said disc transfer means to be moved thereby from said loading station to other said stations in said machine.

9. The apparatus of claim 8 wherein said disc withdrawing means includes a disc gripper positionable adjacent a disc, said gripper including a shaft carrying an inner receiving member insertable into a center hole of said disc and an outer receiving member movable along said shaft to contact the outer edge of said disc whereby said disc is captured between said inner and outer receiving members for movement in said loading station to a position where said disc may be grasped by said disc transfer means.

10. The apparatus of claim 9 including sensor means adjacent said outer receiving member of said disc withdrawing means for confirming the position of said disc in said withdrawing means.

11. The apparatus of claim 1 wherein said loading station comprises:
    disc extracting means for extracting a disc from a disc holding means; and
    linear slide means for moving a disc in said disc extracting means into position to be received by first one of said plurality of horizontal disc gripping means.

12. The apparatus of claim 11 wherein said washing station further comprises:

hose means for delivering washing fluid to said disc while said disc is engaged by said brush means.

13. The apparatus of claim 12 wherein said rinsing station brush means include first and second rotating brushes engaging the surfaces of said disc to clean said disc surface.

14. The apparatus of claim 13 wherein said rinsing station includes means for receiving said disc from said disc transfer means and for supporting said disc for rotation within said rinsing station, means for moving said disc into said rinsing station into engagement with one of said first and second rotating brushes and means for moving the other of said first and second brushes into engagement with said disc after said disc is moved into said rinsing station.

15. The apparatus of claim 14 including means for retaining a disc received from said disc transfer means including first and second support wheels positioned to support the lower outer edge of said disc, and a third support wheel linked to one of said first and second wheels to rotate into position over the top edge of said disc after said disc is positioned to be released by said disc transfer means.

16. The apparatus of claim 15 wherein said disc transfer means includes horizontal disc gripping means mounted to transfer arm means, said horizontal disc gripping means comprising first and second gripping arm members having disc receptacles on ends thereof for gripping said disc during operation of said disc transfer means, the horizontal disc gripping means responsible for delivering discs to said washing station being movable along a circular path about a center of rotation below said first and second support wheels and intermediate said washing station and the prior station from which the disc is transferred so that said disc transfer means may position said disc to be received by said first and second support wheels.

17. The apparatus of claim 16 including means operable to cause said gripping means to release said disc when said third wheel is positioned over the top edge of said disc.

18. The apparatus of claim 17 wherein said first and second support wheels are fixed to shafts extending through said rinsing station, said apparatus including motor means for moving said shafts between a first position aligned with said gripping means of said disc transfer means for transferring a disc and a second position wherein said disc is positioned within the rinsing station of said machine.

19. The apparatus of claim 18 wherein said rinsing station includes first and second rotatable brush means for cleaning the front and rear surfaces of said disc, movement of said disc from said first to said second position bringing said disc into contact with the second brush means, said first brush means being moved by a rotatable shaft from a position out of the path of travel of said disc to a second position in contact with the front surface of said disc.

20. The apparatus of claim 19 wherein said rinsing station further comprises means for causing rotation of said first and second brush means to clean the surfaces of said disc and to cause rotation of said disc past said brush means over said disc support rollers whereby said disc surfaces are cleaned and rinsed by said brushes.

21. The apparatus of claim 20 wherein said rinsing station further comprises:
hose means for delivering rinsing fluid to said disc while said disc is engaged by said brush means.

22. The apparatus of claim 1 wherein said unloading station comprises:
disc delivering means for delivering disc from said arm means to a disc holding means; and
linear slide means for moving said disc delivering means into position to receive a disc from final one of said plurality of horizontal disc gripping means.

23. The apparatus of claim 1 wherein said cleaning station comprises:
in sequence, a washing station;
a rinsing station; and
a drying station.

24. The apparatus of claim 23 wherein each of said washing station, rinsing station and drying station have shield means located adjacent said transfer arm means for protecting an operator and confining cleaning by-products.

25. The apparatus of claim 23 wherein said washing station comprises:
brush means for brushing a disc located at said washing station;
means for moving said brush means to engage and disengage said disc; and
said brush means for rotating said disc when said disc is engaged by said brush means.

26. The apparatus of claim 25 wherein said washing station brush means include first and second rotating brushes engaging the surfaces of said disc to clean said disc surface.

27. The apparatus of claim 26 wherein said washing station includes means for receiving said disc from said disc transfer means and for supporting said disc for rotation within said washing station, means for moving said disc into said washing station into engagement with one of said first and second rotating brushes and means for moving the other of said first and second brushes into engagement with said disc after said disc is moved into said washing station.

28. The apparatus of claim 25 wherein said washing station further comprises:
means for receiving said disc from said disc transfer means and for securely, rotatably and releasably maintaining said received disc at said washing station, said means being movable between a first position aligned with said transfer means and a second position within said washing station.

29. The apparatus of claim 28 wherein said means for retaining said received disc include first and second support wheels positioned to support the lower outer edge of said disc, and a third support wheel linked to one of said first and second wheels to rotate into position over the top edge of said disc after said disc is positioned to be released by said disc transfer means.

30. The apparatus of claim 29 wherein said disc transfer means includes horizontal disc gripping means mounted to said transfer arm means, said horizontal disc gripping means comprising first and second gripping arm members having disc receptacles on ends thereof for gripping said disc during operation of said disc transfer means, the horizontal disc gripping means responsible for delivering discs to said washing station being movable along a circular path about a center of rotation below said first and second support wheels and intermediate said washing station and the prior station from which the disc is transferred so that said disc transfer means may position said disc to be received by said first and second support wheels.

31. The apparatus of claim 30 including means operable to cause said gripping means to release said disc when said third wheel is positioned over the top edge of said disc.

32. The apparatus of claim 30 wherein said first and second support wheels are fixed to shafts extending through said washing station, said apparatus including motor means for moving said shafts between a first position aligned with said horizontal gripping means of said disc transfer means for transferring a disc and a second position wherein said disc is positioned within the washing station of said machine.

33. The apparatus of claim 32 wherein said washing station includes first and second rotatable brush means for cleaning the front and rear surfaces of said disc, movement of said disc from said first to said second position bringing said disc into contact with the second brush means, said first brush means being moved by a rotatable shaft from a position out of the path of travel of said disc to a second position in contact with the front surface of said disc.

34. The apparatus of claim 23 wherein said rinsing station comprises:
brush means for brushing a disc located at said rinsing station;
means for moving said brush means to engage and disengage said disc; and
means for rotating said disc when said disc is engaged by said brush means.

35. The apparatus of claim 23 wherein said drying station further comprises:
means for receiving said disc from said disc transfer means and for returning said disc to said disc transfer means; and
means for rotating said received disc to remove extraneous moisture therefrom.

36. The apparatus of claim 35 wherein said disc transfer means includes horizontal disc gripping means mounted to the transfer arm means, said horizontal disc gripping means comprising first and second gripping arm members having disc receptacles on ends thereof for gripping said disc during operation of said disc transfer means, the horizontal disc gripping means responsible for delivering discs to said drying station being movable along a circular path about a center of rotation below said first and second support wheels and intermediate said washing station and the prior station from which the disc is transferred so that said disc transfer means may position said disc to be received by said first and second support wheels, said drying station including an extendable spindle shaft for gripping said disc and retaining it in said drying station after removal of said disc from said disc transfer means.

37. The apparatus of claim 36 including means for extending said extendable spindle shaft into the plane of said discs while said disc is supported by said disc transfer means, and means on said shaft for holding said disc within said drying station.

38. The apparatus of claim 37 wherein said means for holding said disc comprise securing members carried on the end of said shaft and diverged from the end of said shaft when said shaft is extended toward said disc to grip said disc by grasping an inner surface defining a central opening of said disc.

39. The apparatus of claim 38 including a protective shield supported adjacent a drying position for said disc, a shaft supporting said shield and motor means for moving said shield to cover said disc when said disc is in said drying position.

40. The apparatus of claim 39 including motor means attached to said spindle shaft for rotating said shaft to spin said disc and thereby dry the surfaces of the disc.

41. An automated disc washing machine of the type having a plurality of cleaning stations, comprising:
loading means for loading a disc into said disc washing machine;
a plurality of cleaning stations for cleaning a disc;
unloading means for unloading said cleaned disc from said automated disc washing machine, said loading means, plurality of cleaning stations and unloading means being positioned substantially in a linear sequence; and
disc transfer means, including transfer arm means capable of pivoting between a first position for receiving said disc and a second position for unloading said disc, and being located adjacent said sequence of said loading station, plurality of cleaning stations and unloading station, for simultaneously transferring discs from each of said loading station and plurality of cleaning stations to their next respective cleaning or unloading station along said sequence, each full cycle of said disc transfer means capable of accomplishing one of each of said station to station transfer cycles, for sequentially and linearly transferring said discs from said loading means through each of said plurality of cleaning stations and to said unloading means.

42. An automated disc washing machine as claimed in claim 41 wherein said disc transfer means further comprising a plurality of disc gripping means mounted on said transfer arm means for securely and releasably holding a disc, said gripping means capable of receiving and securing a disc at said loading means and each of said cleaning stations when said transfer arm means is in said first position and releasing a disc at each of said cleaning stations and said unloading means when said transfer arm means is in said second position.

43. A computer controlled automated disc washing machine, comprising:
a sequence of stations including at least a loading station having loading means, a cleaning station having cleaning means and an unloading station having unloading means;
pivoted transfer arm means capable of pivoting between a first position and a second position, located adjacent said sequence of said loading station, cleaning station and unloading station, for sequentially, linearly and simultaneously transferring a first disc from said loading station to said cleaning station and a second disc from said cleaning station to said unloading station;
said transfer arm means further comprising a plurality of disc gripping means mounted thereon for securely and releasable holding a disc, said gripping means receiving and securing a disc at said loading station and said cleaning stations when said transfer arm is in said first position and releasing a disc at said cleaning station and said unloading station when said transfer arm is in said second position;
motor means for driving said transfer arm, gripping means and said loading, cleaning and unloading means; and
computer means for coordinating movement of said transfer arm means, gripping means and said loading, cleaning and unloading stations.

* * * * *